United States Patent
Song et al.

(10) Patent No.: US 10,205,169 B2
(45) Date of Patent: Feb. 12, 2019

(54) ANODE ACTIVE MATERIAL FOR LITHIUM SECONDARY BATTERY, MANUFACTURING METHOD THERE-FOR, ANODE FOR LITHIUM SECONDARY BATTERY COMPRISING SAME, AND LITHIUM SECONDARY BATTERY

(71) Applicant: LG Chem, Ltd., Seoul (KR)

(72) Inventors: Jun Hyuk Song, Daejeon (KR); Eun Kyung Kim, Daejeon (KR); Sang Wook Woo, Daejeon (KR); Sung Bin Park, Daejeon (KR); Ye Ri Kim, Daejeon (KR); Ju Ho Chung, Daejeon (KR)

(73) Assignee: LG Chem, Ltd. (KR)

( * ) Notice: Subject to any disclaimer, the term of this patent is extended or adjusted under 35 U.S.C. 154(b) by 278 days.

(21) Appl. No.: 15/032,396

(22) PCT Filed: Sep. 23, 2015

(86) PCT No.: PCT/KR2015/010003
§ 371 (c)(1),
(2) Date: Apr. 27, 2016

(87) PCT Pub. No.: WO2016/052910
PCT Pub. Date: Apr. 7, 2016

(65) Prior Publication Data
US 2016/0276672 A1    Sep. 22, 2016

(30) Foreign Application Priority Data

Sep. 30, 2014 (KR) ........................ 10-2014-0131018

(51) Int. Cl.
*H01M 4/62* (2006.01)
*H01M 4/485* (2010.01)
(Continued)

(52) U.S. Cl.
CPC ............ *H01M 4/628* (2013.01); *C01D 15/02* (2013.01); *C01G 23/005* (2013.01); *C23C 16/56* (2013.01);
(Continued)

(58) Field of Classification Search
CPC .. H01M 4/628; H01M 4/0471; H01M 4/0492; H01M 4/366; H01M 4/485; H01M 10/052; H01M 10/0525
See application file for complete search history.

(56) References Cited

U.S. PATENT DOCUMENTS

| 6,139,815 A | 10/2000 | Atsumi et al. |
| 9,029,022 B2* | 5/2015 | Miyagi ................. H01M 4/131 429/188 |

(Continued)

FOREIGN PATENT DOCUMENTS

| CN | 102290562 A | 12/2011 |
| CN | 103779550 A | 5/2014 |

(Continued)

OTHER PUBLICATIONS

International Search Report from PCT/KR2015/010003, dated Jan. 2, 2016.
(Continued)

*Primary Examiner* — Helen Oi K Conley
(74) *Attorney, Agent, or Firm* — Lerner, David, Littenberg, Krumholz & Mentlik, LLP

(57) ABSTRACT

A negative active material for rechargeable lithium secondary batteries, a method of preparing the same, and a rechargeable lithium secondary battery including the same are disclosed. The negative active material includes a core including a lithium titanium oxide of Formula 1, and a coating layer positioned on a surface of the core and including an acid anhydride physisorbed onto the core, and
(Continued)

thus can be useful in inhibiting battery side reactions and gas generation and improving battery performance since moisture formed during a redox reaction is effectively absorbed into a surface of the negative active material.

$$Li_xTi_yO_4 \qquad \text{[Formula 1]}$$

In Formula 1, x and y are as defined in the detailed description.

10 Claims, 2 Drawing Sheets

(51) Int. Cl.
*H01M 10/052* (2010.01)
*C23C 16/56* (2006.01)
*H01M 4/04* (2006.01)
*H01M 4/36* (2006.01)
*H01M 10/0525* (2010.01)
*C01D 15/02* (2006.01)
*C01G 23/00* (2006.01)
*H01M 4/02* (2006.01)

(52) U.S. Cl.
CPC ....... *H01M 4/0471* (2013.01); *H01M 4/0492* (2013.01); *H01M 4/366* (2013.01); *H01M 4/485* (2013.01); *H01M 10/052* (2013.01); *H01M 10/0525* (2013.01); *C01P 2004/61* (2013.01); *C01P 2006/40* (2013.01); *C01P 2006/82* (2013.01); *H01M 2004/027* (2013.01); *Y02T 10/7011* (2013.01)

(56) References Cited

U.S. PATENT DOCUMENTS

| | | |
|---|---|---|
| 2011/0165465 A1 | 7/2011 | Kim et al. |
| 2011/0311866 A1 | 12/2011 | Lim et al. |
| 2013/0189584 A1 | 7/2013 | Inagaki et al. |
| 2014/0113197 A1 | 4/2014 | Xiao et al. |
| 2015/0079467 A1 | 3/2015 | Ahn et al. |

FOREIGN PATENT DOCUMENTS

| | | |
|---|---|---|
| JP | H09199129 A | 7/1997 |
| JP | 2003242981 A | 8/2003 |
| JP | 2004235144 A | 8/2004 |
| JP | 2007018828 A | 1/2007 |
| JP | 2011113924 A | 6/2011 |
| JP | 2011146154 A | 7/2011 |
| JP | 2012234665 A | 11/2012 |
| JP | 2013012461 A | 1/2013 |
| JP | 2013149486 A | 8/2013 |
| JP | 2014075238 A | 4/2014 |
| KR | 20110080827 A | 7/2011 |
| KR | 20120071448 A | 7/2012 |
| KR | 20130106610 A | 9/2013 |
| KR | 20140008263 A | 1/2014 |
| WO | 99004442 A1 | 1/1999 |

OTHER PUBLICATIONS

Extended Search Report from European Application No. 15847257.1, dated Nov. 10, 2016.
Search Report from Notice of Allowance from Taiwanese Application No. 104131797, dated Sep. 30, 2016.
Chinese Search Report for Application No. 201580004074.5 dated Dec. 20, 2017.

* cited by examiner

[FIG. 1]
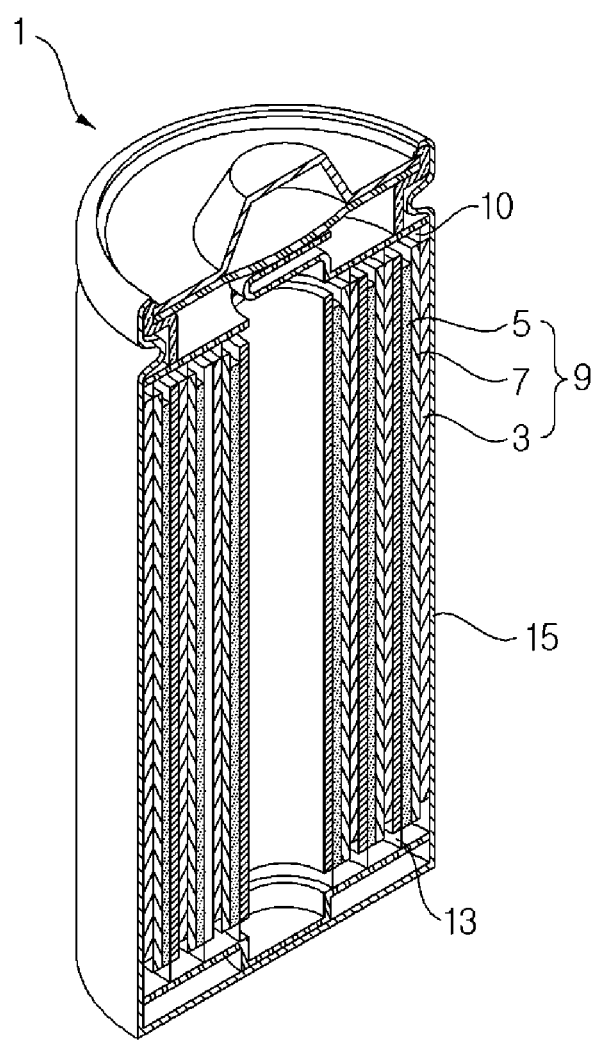

[FIG. 2]
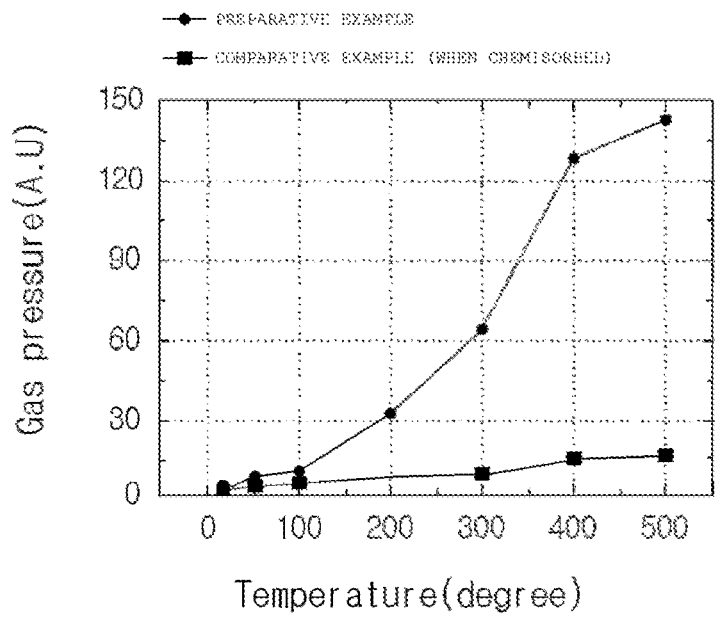
[FIG. 3]
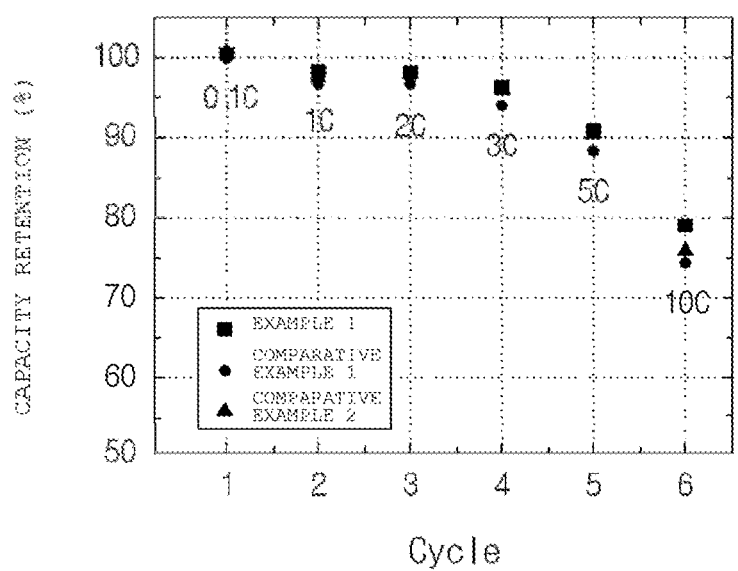

ANODE ACTIVE MATERIAL FOR LITHIUM SECONDARY BATTERY, MANUFACTURING METHOD THERE-FOR, ANODE FOR LITHIUM SECONDARY BATTERY COMPRISING SAME, AND LITHIUM SECONDARY BATTERY

CROSS-REFERENCE TO RELATED APPLICATION

This application is a national phase entry under 35 U.S.C. § 371 of International Application No. PCT/KR2015/010003, filed Sep. 23, 2015, which claims priority to Korean Patent Application No. 10-2014-0131018, filed Sep. 30, 2014, the disclosures of which are incorporated herein by reference.

BACKGROUND OF THE INVENTION

Field of the Invention

The present invention relates to a negative active material for rechargeable lithium secondary batteries capable of inhibiting battery side reactions and gas generation and improving battery performance since moisture formed during an oxidation-reduction (redox) reaction is effectively absorbed into a surface of the negative active material, a method of preparing the same, and a rechargeable lithium secondary battery including the same.

Description of the Related Art

Rechargeable lithium secondary batteries (e.g., lithium ion batteries), nickel-hydrogen batteries, and other secondary batteries have been recognized to be of growing importance as vehicle-mounted power sources, or power sources for portable terminals such as laptop computers. In particular, rechargeable lithium secondary batteries which are light-weight and may have a high energy density may be desirably used as high-output power sources for vehicle mounting, and thus demand for rechargeable lithium secondary batteries is expected to increase in the future.

A rechargeable lithium secondary battery is manufactured by installing a porous separation film between a positive electrode and a negative electrode, followed by injecting a liquid electrolyte between the positive electrode and the negative electrode. Here, a material in which lithium ions are intercalatable and deintercalatable is used as the negative electrode or a negative active material and negative electrodes. In this case, electricity may be produced or consumed by a redox reaction caused by intercalation/deintercalation of lithium ions into/from the negative and positive electrodes.

Specifically, various types of carbon-based materials, in which lithium ions are intercalatable and deintercalatable and which include synthetic graphite, natural graphite, and hard carbon, have been applied as the negative active materials in the case of the rechargeable lithium secondary batteries. Among the carbon-based materials, graphite has a discharge voltage of −0.2 V lower than lithium, and thus secondary batteries in which graphite is used as a negative active material may have a high discharge voltage of 3.6 V. In addition, graphite has been most widely used since it may be advantageous in terms of the energy density of rechargeable lithium secondary batteries, and may ensure long lifespan of the rechargeable lithium secondary batteries due to excellent reversibility thereof. However, such graphite active materials have a problem in that they have low capacity with respect to the energy density of electrode plates per unit volume since graphite has a low density (a theoretical density of 2.2 g/cc), and side reactions with an organic electrolyte solution used at a high discharge voltage may easily occur upon manufacture of the electrode plates, resulting in swelling of the batteries, and thus battery capacity degradation.

To solve the above problems regarding such carbon-based negative active materials, Si-based negative active materials having a much higher capacity than graphite, and negative active materials using oxides such as tin oxide, lithium vanadium-based oxide, and lithium titanium-based oxide have been developed and researched.

However, the high-capacity, Si-based negative active materials undergo serious changes in volume during charge/discharge cycles, and thus lifespan characteristics may be deteriorated due to particle splitting.

In addition, oxide negative electrodes do not show satisfactory battery performance, and thus research on the oxide negative electrodes continues to be conducted. Among these, lithium titanium oxide (hereinafter referred to as "LTO") does not form a solid electrolyte interface (SEI) layer due to poor reactivity with an electrolyte solution. Therefore, LTO is advantageous in terms of an irreversible reaction, and thus has very stable lifespan characteristics. Owing to excellent reversibility, LTO may also be desirably used to charge and discharge the secondary batteries at a high speed during intercalation/deintercalation of lithium (Li) ions. However, LTO has a high content of moisture, and thus has a drawback in that battery performance may be degraded due to the presence of moisture, and thus gas generation.

Therefore, there is a demand for development of methods capable of inhibiting generation of gases caused by moisture in the LTO-based negative active material itself, thereby preventing degradation of battery performance.

PRIOR-ART DOCUMENT

Patent Document

Korean Unexamined Patent Publication No. 2008-0018737 (published on Feb. 28, 2008)

SUMMARY OF THE INVENTION

Therefore, the present invention has been made in view of the above problems, and it is an object of the present invention to provide a negative active material capable of inhibiting battery side reactions and gas generation and improving battery performance since moisture formed during a redox reaction is effectively absorbed into a surface of the negative active material, and a method of preparing the same.

It is another object of the present invention to provide a rechargeable lithium secondary battery capable of showing improved battery performance, which includes the negative active material.

In accordance with the present invention, the above and other objects can be accomplished by the provision of a negative active material for rechargeable lithium secondary batteries which includes a core including a lithium titanium oxide represented by the following Formula 1, and a coating layer positioned on a surface of the core, wherein the coating layer includes an acid anhydride physically absorbed (i.e., physisorbed) into the core:

$$Li_xTi_yO_4 \qquad \text{[Formula 1]}$$

wherein $0.8 \le x \le 1.4$, and $1.6 \le y \le 2.2$.

In the negative active material, the core may contain at least one surface functional group selected from the group consisting of $O^-$ and $CO_2^-$.

In addition, the lithium titanium oxide of Formula 1 may be $Li_4Ti_5O_{12}$ having a spinel structure.

Additionally, the acid anhydride may include at least one selected from the group consisting of a carboxylic anhydride, a maleic anhydride, and an acetic anhydride.

Further, the coating layer may be included in an amount of 0.5 to 3 parts by weight, based on 100 parts by weight of the core.

In accordance with another aspect of the present invention, there is provided a method of preparing a negative active material for rechargeable lithium secondary batteries, which includes preparing a core containing at least one surface functional group selected from the group consisting of $O^-$ and $CO_2^-$ by mixing a lithium source and a titanium source so as to prepare a lithium titanium oxide of Formula 1, and calcining the resulting mixture at a temperature of 750 to 800° C., which is less than a typical calcination temperature, and physisorbing an acid anhydride of an organic acid onto a surface of the core by treating the core containing the surface functional group with a solution including the organic acid, and drying the core.

In the method, the organic acid may be a carboxylic acid containing 1 to 3 carboxyl groups in a molecule thereof.

In addition, the organic acid may include at least one selected from the group consisting of acetic acid, propionic acid, stearic acid, pyruvic acid, acetoacetic acid, glyoxylic acid, oxalic acid, malonic acid, maleic acid, glutaric acid, adipic acid, phthalic acid, trimellitic acid, and a mixture thereof.

Additionally, the organic acid may be included in an amount of 0.5 to 3% by weight, based on the total weight of the solution including the organic acid.

Further, the drying may be performed at 60 to 130° C. under vacuum.

It is yet another object of the present invention to provide a rechargeable lithium secondary battery which includes a positive electrode including a positive active material, a negative electrode including a negative active material and arranged to face the positive electrode, and an electrolyte solution interposed between the positive electrode and the negative electrode, wherein the negative active material includes a core including a lithium titanium oxide of Formula 1, and a coating layer positioned on a surface of the core, and the coating layer includes an acid anhydride physisorbed onto the core.

Specific content of the other exemplary embodiments of the present invention are encompassed in the following detailed description.

BRIEF DESCRIPTION OF THE DRAWINGS

The above and other objects, features and other advantages of the present invention will be more clearly understood from the following detailed description taken in conjunction with the accompanying drawings, in which:

FIG. 1 is an exploded perspective view showing a rechargeable lithium secondary battery according to one exemplary embodiment of the present invention;

FIG. 2 is a graph illustrating results obtained by determining whether gases are generated according to the temperature of a negative active material used in Experimental Example 2 of the present invention; and FIG. 3 is a graph illustrating experimental results obtained by measuring input/output characteristics of rechargeable lithium secondary batteries manufactured in Example 1 and Comparative Examples 1 and 2 as described in Experimental Example 3 of the present invention.

BRIEF DESCRIPTION OF MAIN PARTS IN THE DRAWINGS

1: rechargeable lithium secondary battery
3: negative electrode
5: positive electrode
7: separator
9: electrode assembly
10, 13: lead members
15: cases

DETAILED DESCRIPTION OF THE INVENTION

Hereinafter, preferred embodiments of the present invention will be described in detail with reference to the accompanying drawings so as to enable those skilled in the art to easily embody the present invention. However, it should be understood that the present invention may be embodied in various different forms, but is not limited to the above-described embodiments.

The terminology used herein is for the purpose of describing particular embodiments only and is not intended to be limiting of exemplary embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, whole numbers, steps, operations, elements, components and/or groups thereof.

The present invention is characterized in that a negative active material is prepared by immersing an LTO-based negative active material pretreated to contain a surface functional group in a solution including an organic acid such as maleic acid, drying the LTO-based negative active material, and physisorbing the organic acid onto a surface of LTO in the form of an acid anhydride, and thus may be useful in inhibiting battery side reactions and gas generation and improving battery performance since moisture formed during a redox reaction is effectively absorbed into a surface of the negative active material.

That is, the negative active material for rechargeable lithium secondary batteries according to one exemplary embodiment of the present invention includes a core including a lithium titanium oxide represented by the following Formula 1, and a coating layer positioned on a surface of the core, wherein the coating layer includes an acid anhydride physisorbed onto the core:

$$Li_xTi_yO_4 \qquad \text{[Formula 1]}$$

wherein $0.8 \leq x \leq 1.4$, and $1.6 \leq y \leq 2.2$.

Specifically, in the negative active material, the core may be formed of $Li_4Ti_5O_{12}$ having a spinel structure. In this case, the number of moles of oxygen in Formula 1 is represented by a fixed value of 4, but Formula 1 is not limited thereto. For example, the number of moles of oxygen may be represented as multiples of the number of moles within a range in which a ratio of the number of moles of the respective elemental atoms in Formula 1 is satisfied. That is, when the number of moles of oxygen in Formula 1 is 12, the lithium titanium oxide of Formula 1 may be represented by $Li_{3x}Ti_{3y}O_{12}$. $Li_4Ti_5O_{12}$ having a spinel structure may serve to prevent an SEI film from being formed on a surface of the negative electrode to an excessively large thickness, and improve electrochemical characteristics and safety of the secondary batteries under the control of thermal runaway factors. In addition, the $Li_4Ti_5O_{12}$ may promote transportation of Li ions to impart rapid charge/discharge characteristics to the secondary batteries.

The core contains at least one surface functional group selected from the group consisting of $O^-$ and $CO_2^-$ to allow physisorption of the acid anhydride during preparation of the negative active material.

In addition, the core including the above-described lithium titanium oxide may have an average particle diameter of 3 to 15 μm in consideration of the specific surface area and negative electrode mix density of the active material.

Additionally, the coating layer positioned on a surface of the core includes an acid anhydride physisorbed onto the core.

The acid anhydride is derived from an organic acid, particularly an organic acid containing at least one carboxyl group in a molecule thereof. In this case, the acid anhydride is present in a state in which the acid anhydride is physisorbed onto a surface of the core, but when moisture is formed during a redox reaction, the acid anhydride preferentially reacts with the moisture so that the acid anhydride is converted into an acid. As such, since the acid anhydride reacts with the moisture immediately after moisture is formed on a surface of the active material, side reactions and gas generation caused by moisture in all the secondary batteries may be inhibited.

[Scheme 1]

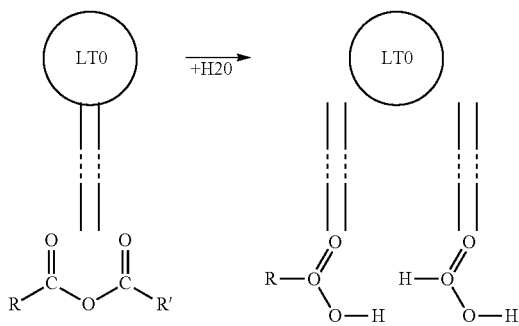

Types of the acid anhydride may vary according to the type of the organic acid used to prepare the negative active material. Specifically, the acid anhydride may include a carboxylic anhydride, a maleic anhydride, an acetic anhydride, and a mixture thereof.

In the negative active material, the coating layer including the acid anhydride may be included in an amount of 0.5 to 3 parts by weight, based on 100 parts by weight of the core. When the content of the coating layer is less than 0.5 parts by weight, it is difficult to coat the core completely, and thus the lithium titanium oxide constituting the core may be exposed to the outside, resulting in side reactions caused by generated moisture and thus gas generation. On the other hand, when the content of the coating layer is greater than 3 parts by weight, reduction in initial battery efficiency and performance degradation may be caused due to an increase in thickness of the coating layer. Considering that the negative active material shows significant improvement effects due to formation of the coating layer, the coating layer may also be included in an amount of 1 to 2 parts by weight, based on 100 parts by weight of the core.

According to another exemplary embodiment of the present invention, there is provided a method of preparing the above-described negative active material, which includes preparing a core containing at least one surface functional group selected from the group consisting of $O^-$ and $CO_2^-$ by mixing a lithium source and a titanium source so as to prepare a lithium titanium oxide of Formula 1 and calcining the resulting mixture at a temperature of 750 to 800° C., which is less than a typical calcination temperature, and physisorbing an acid anhydride of an organic acid onto a surface of the core by immersing the core containing the surface functional group in a solution including the organic acid and drying the core.

Hereinafter, respective steps of the method will be described in detail, as follows. The first step includes preparing a core including the lithium titanium oxide of Formula 1 containing at least one surface functional group selected from the group consisting of $O^-$ and $CO_2^-$.

To prepare the core including the lithium titanium oxide, the core may be prepared by mixing a lithium source and a titanium source at an atomic ratio between lithium and titanium (4 lithium atoms and 5 titanium atoms in the case of $Li_4Ti_5O_{12}$), stirring and drying the resulting mixture to prepare a precursor, and calcining the precursor. The lithium source may be a solution obtained by dissolving lithium salts, such as lithium hydroxide, lithium carbonate and lithium oxide, in water, and the titanium source may be titanium oxide, etc.

Accordingly, the core containing a surface functional group selected from $O^-$ and $CO_2^-$, both of which are generated when the lithium source is added, may be prepared by mixing the lithium and titanium sources used to prepare the lithium titanium oxide, and calcining the resulting mixture at a temperature of 750 to 800° C., which is less than a typical calcination temperature.

The second step includes physisorbing the acid anhydride of the organic acid onto a surface of the core containing the surface functional group.

Specifically, the core containing the surface functional group is immersed in a solution including the organic acid, and then dried at 60° C. or higher, or 60 to 130° C. under vacuum to physisorb the organic acid onto a surface of the core in the form of an acid anhydride.

In this case, the organic acid may be an organic acid containing one or more carboxyl groups, or 1 to 3 carboxyl groups in a molecule thereof. Specifically, the organic acid may include a monocarboxylic acid such as acetic acid, propionic acid, stearic acid, pyruvic acid, acetoacetic acid, or glyoxylic acid; or a polyvalent carboxylic acid such as oxalic acid, malonic acid, maleic acid, glutaric acid, adipic acid, phthalic acid, or trimellitic acid, which may be used alone or in combination of two or more thereof. Among these, acetic acid or maleic acid may be more preferred in an aspect of significant improvement effects.

To treat the surface-treated core with the organic acid, the organic acid may be used in a solution phase in which the organic acid is dissolved in water, etc. Specifically, the acid anhydride of the organic acid may be used in a ratio of 0.1 to 3 moles, based on one mole of the lithium titanium oxide, in consideration of the content of the acid anhydride in the finally prepared negative active material capable of showing the effects according to exemplary embodiments of the present invention. Therefore, the solution including the organic acid may include the organic acid in a concentration of 0.1 to 2 moles. Considering this fact, the organic acid may be included in an amount of 0.5 to 3% by weight, based on the total weight of the solution including the organic acid.

In addition, the treatment of the surface-treated core with the organic acid may be performed using a method such as immersion, spraying, coating, etc. Among these, immersion may be used to treat the core with the organic acid in consideration of surface treatment of the core and ease of processing.

Next, the drying after treatment with the organic acid may be performed at 60 to 130° C. under vacuum. When the drying temperature is less than 60° C., the organic acid may be present on a surface of the core in the form of an organic acid rather than an acid anhydride. On the other hand, when the drying temperature is greater than 130° C., the acid anhydride and the lithium titanium oxide may chemically react with each other, resulting in ineffective moisture absorption.

The results of the preparation method as described above show that the organic acid is physisorbed onto a surface of the core including the LTD of Formula 1 in the form of an acid anhydride. When the acid anhydride is physisorbed onto the surface of the core as described above, there is a difference in that the acid anhydride may preferentially absorb moisture before the moisture reacts with LTD since the acid anhydride is uniformly distributed on a surface of the core, compared to when the acid anhydride may be simply mixed with the core to prepare a negative electrode, or when a surface of the core is treated with the acid anhydride itself to prepare a negative active material. Owing to such a difference, the negative active material may have superior effects in terms of battery lifespan and rate performance. In addition, when the LTO-based core is surface-treated in the form of an acid anhydride as described above, the acid anhydride may be much purer since a smaller amount of residual substances is present on a surface of the core, compared to when the LTO-based core is surface-treated in the form of an acid or a salt thereof. Therefore, the acid anhydride may be more favorable in terms of reduction in side reactions.

According to yet another exemplary embodiment of the present invention, there is provided a rechargeable lithium secondary battery including the negative active material prepared by the above-described preparation method.

Specifically, the rechargeable lithium secondary battery includes a positive electrode including a positive active material, a negative electrode including a negative active material and arranged to face the positive electrode, and an electrolyte solution interposed between the positive electrode and the negative electrode. Here, the negative active material is as described above.

The rechargeable lithium secondary batteries may be classified into lithium ion batteries, lithium ion polymer batteries, and lithium polymer batteries according to types of separators and electrolytes used herein, and may also be classified into cylindrical secondary batteries, square secondary batteries, coin-type secondary batteries, pouch-type secondary batteries, etc. according to the shapes thereof. In addition, the rechargeable lithium secondary batteries may be classified into bulk-type secondary batteries and film-type secondary batteries according to the size thereof.

FIG. 1 is an exploded perspective view showing a rechargeable lithium secondary battery 1 according to one exemplary embodiment of the present invention. FIG. 1 is merely an example for the purpose of illustration only, and is not intended to limit the scope of the present invention.

Referring to FIG. 1, the rechargeable lithium secondary battery 1 may be prepared by arranging a negative electrode 3 and a positive electrode 5, disposing a separator 7 between the negative electrode 3 and the positive electrode 5 to manufacture an electrode assembly 9, positioning the electrode assembly 9 in a case 15, and injecting an electrolyte (not shown) so that the negative electrode 3, the positive electrode 5, and the separator 7 are impregnated with the electrolyte.

Conductive lead members 10 and 13 for collecting current occurring when a battery is operating may be attached to the negative electrode 3 and the positive electrode 5, respectively. The lead members 10 and 13 may conduct current generated from the positive electrode 5 and the negative electrode 3 to positive and negative electrode terminals, respectively.

The negative electrode 3 may be manufactured by mixing a negative active material, a binder, and optionally a conductive material to prepare a composition for forming a negative active material layer, followed by applying the composition to a negative current collector such as copper foil.

The negative active material is as described above.

The binder serves to attach electrode active material particles to each other, and also attach an electrode active material to a current collector. Specific examples of the binder that may be used herein may include polyvinylidene fluoride (PVDF), polyvinyl alcohol, carboxymethyl cellulose (CMC), starch, hydroxypropyl cellulose, regenerated cellulose, polyvinyl pyrrolidone, tetrafluoroethylene, polyethylene, polypropylene, an ethylene-propylene-diene polymer (EPDM), sulfonated EPDM, a styrene-butadiene rubber, a fluorine rubber, and various copolymers thereof.

In addition, preferred examples of the solvent may include dimethyl sulfoxide (DMSO), alcohol, N-methylpyrrolidone (NMP), acetone, water, etc.

The current collector may include at least one metal selected from the group consisting of copper, aluminum, stainless steel, titanium, silver, palladium, nickel, and alloys and combinations thereof. In this case, the stainless steel may be surface-treated with carbon, nickel, titanium, or silver, and an aluminum-cadmium alloy may be preferably used as the alloy. In addition, baked carbon, a non-conductive polymer surface-treated with a conductive material, a conductive polymer, or the like may be used.

The conductive material is used to provide conductivity to an electrode and may include any materials that are electrically conductive without inducing chemical changes in the battery thus configured. Examples of the conductive material that may be used herein may include metal powders and fibers such as natural graphite, synthetic graphite, carbon black, acetylene black, Ketjen black, carbon fiber, copper, nickel, aluminum, silver, etc. In addition, the conductive materials such as polyphenylene derivatives may be used alone or in combination of one or more thereof.

As a method of applying the prepared composition for forming a negative active material layer to the current collector, one of known methods may be chosen, or a new proper method may be used in consideration of characteristics of materials, etc. For example, the composition for forming a negative active material layer may be distributed onto the current collector, and then uniformly dispersed using a doctor blade. In some cases, distribution and dispersion processes may be carried out as one process. In addition, methods such as die casting, comma coating, screen printing, etc. may also be used. Like the negative electrode 3, the positive electrode 5 may be manufactured by mixing a positive active material, a conductive material, and a binder to prepare a composition for forming a positive active material layer, followed by applying the composition for forming a positive active material layer onto a positive current collector such as aluminum foil and rolling the positive current collector. A positive electrode plate may also be manufactured by casting the composition for forming a positive active material layer onto a separate support and then laminating a film obtained through peeling from the support on a metal current collector.

A compound in which lithium ions are reversibly intercalatable and deintercalatable (i.e., a lithiated intercalation compound) may be used as the positive active material. Specifically, a lithium-containing transition metal oxide is preferably used. For example, the positive active material that may be used herein may include at least one selected from group consisting of $LiCoO_2$, $LiNiO_2$, $LiMnO_2$, $LiMn_2O_4$, $Li(Ni_aCo_bMn_c)O_2$ ($0<a<1$, $0<b<1$, $0<c<1$, and $a+b+c=1$), $LiNi_{1-y}Co_yO_2$, $LiCo_{1-y}Mn_yO_2$, $LiNi_{1-y}Mn_yO_2$ ($0 \leq y<1$), $Li(Ni_aCo_bMn_c)O_4$ ($0<a<2$, $0<b<2$, $0<c<2$, and $a+b+c=2$), $LiMn_{2-z}Ni_zO_4$, $LiMn_{2-z}Co_zO_4$ ($0<z<2$), $LiCoPO_4$, $LiFePO_4$, and a mixture of two or more thereof. In addition to such oxides, sulfides, selenides, halides, etc. may also be used herein.

The conductive material and the binder are as described above in advance in the negative electrode.

The electrolyte may include an organic solvent and a lithium salt.

Any organic solvent may be used as the organic solvent without particular limitation as long as such an organic solvent can serve as a medium through which ions involved in electrochemical reaction of a battery may migrate. Specific examples of the organic solvent that may be used herein may include an ester solvent, an ether solvent, a ketone solvent, an aromatic hydrocarbon solvent, an alkoxy alkane solvent, a carbonate solvent, and the like, which may be used alone or in combination of two or more thereof.

Specific examples of the ester solvent may include methyl acetate, ethyl acetate, n-propyl acetate, dimethyl acetate, methyl propionate, ethyl propionate, γ-butyrolactone, decanolide, γ-valerolactone, mevalonolactone, γ-caprolactone, δ-valerolactone, ε-caprolactone, etc.

Specific examples of the ether-based solvent may include dibutyl ether, tetraglyme, 2-methyltetrahydrofuran, tetrahydrofuran, etc.

Specific examples of the ketone-based solvent may include cyclohexanone, etc. Specific examples of the aromatic hydrocarbon-based organic solvent may include benzene, fluorobenzene, chlorobenzene, iodobenzene, toluene, fluorotoluene, xylene, etc. Examples of the alkoxy alkane solvent may include dimethoxy ethane, diethoxy ethane, etc.

Specific examples of the carbonate solvent may include dimethyl carbonate (DMC), diethyl carbonate (DEC), dipropyl carbonate (DPC), methylpropyl carbonate (MPC), ethylpropyl carbonate (EPC), methylethyl carbonate (MEC), ethyl methyl carbonate (EMC), ethylene carbonate (EC), propylene carbonate (PC), butylene carbonate (BC), fluoroethylene carbonate (FEC), etc.

The lithium salt may be used without particular limitation as long as it is a compound that can provide lithium ions used in the rechargeable lithium secondary battery 1. Specifically, the lithium salt that may be used herein may include at least one selected from the group consisting of $LiPF_6$, $LiClO_4$, $LiAsF_6$, $LiBF_4$, $LiSbF_6$, $LiAlO_4$, $LiAlCl_4$, $LiCF_3SO_3$, $LiC_4F_9SO_3$, $LiN(C_2F_5SO_3)_2$, $LiN(C_2F_5SO_2)_2$, $LiN(CF_3SO_2)_2$, $LiN(C_aF_{2a+1}SO_2)(C_bF_{2b+1}SO_2)$ (where a and b are integers, preferably $1 \leq a \leq 20$ and $1 \leq b \leq 20$), LiCl, LiI, $LiB(C_2O_4)_2$, and a mixture thereof.

When the lithium salt is dissolved in an electrolyte, the lithium salt functions as a supply source of lithium ions in the lithium secondary battery 1 and may facilitate migration of lithium ions between the positive electrode 5 and the negative electrode 3. Therefore, the lithium salt may be included in a concentration of approximately 0.6 M to 2 M in the electrolyte. When the concentration of the lithium salt is less than 0.6 M, conductivity of the electrolyte may be degraded, resulting in deteriorated electrolyte performance. When the concentration of the lithium salt is greater than 2 M, mobility of lithium ions may be reduced due to increase in viscosity of the electrolyte. Accordingly, the concentration of the lithium salt may be particularly adjusted to approximately 0.7 to 1.6 M in the electrolyte in consideration of electrolyte conductivity and lithium ion mobility.

In addition to the constituents of the electrolyte, the electrolyte may further include additives (hereinafter referred to as "other additives") that may be generally used in the electrolyte so as to enhance battery lifespan characteristics, inhibit decrease in battery capacity, and enhance battery discharge capacity.

Specific examples of the other additives may include vinylene carbonate (VC), metal fluoride (for example, LiF, RbF, TiF, AgF, $AgF_2$, $BaF_2$, $CaF_2$, $CdF_2$, $FeF_2$, $HgF_2$, $Hg_2F_2$, $MnF_2$, $NiF_2$, $PbF_2$, $SnF_2$, $SrF_2$, $XeF_2$, $ZnF_2$, $AlF_3$, $BF_3$, $BiF_3$, $CeF_3$, $CrF_3$, $DyF_3$, $EuF_3$, $GaF_3$, $GdF_3$, $FeF_3$, $HoF_3$, $InF_3$, $LaF_3$, $LuF_3$, $MnF_3$, $NdF_3$, $PrF_3$, $SbF_3$, $ScF_3$, $SmF_3$, $TbF_3$, $TiF_3$, $TmF_3$, $YF_3$, $YbF_3$, $TIF_3$, $CeF_4$, $GeF_4$, $HfF_4$, $SiF_4$, $SnF_4$, $TiF_4$, $VF_4$, $ZrF_4$, $NbF_5$, $SbF_5$, $TaF_5$, $BiF_5$, $MoF_6$, $ReF_6$, $SF_6$, $WF_6$, $CoF_2$, $CoF_3$, $CrF_2$, CsF, $ErF_3$, $PF_3$, $PbF_3$, $PbF_4$, $ThF_4$, $TaF_5$, $SeF_6$, etc.), glutaronitrile (GN), succinonitrile (SN), adiponitrile (AN), 3,3'-thiodipropionitrile (TPN), vinylethylene carbonate (VEC), fluoroethylene carbonate (FEC), difluoroethylene carbonate, fluorodimethyl carbonate, fluoroethyl methyl carbonate, lithium bis(oxalato)borate (LiBOB), lithium difluoro(oxalato) borate (LiDFOB), lithium (malonato oxalato)borate (LiMOB), etc. which may be used alone or in combination of two or more thereof. The other additives may be included in an amount of 0.1 to 5% by weight, based on the total weight of the electrolyte.

Any separator may be used as the separator 7 without particular limitation as long as such separator is generally used in the lithium secondary batteries. In particular, a separator having low resistance to ion migration of the electrolyte and an excellent ability to moisturize the electrolyte may be used. Specifically, a porous polymer film, for example, a porous polymer film manufactured from a polyolefin-based polymer such as an ethylene homopolymer, a propylene homopolymer, an ethylene/butene copolymer, an ethylene/hexene copolymer, and an ethylene/methacrylate copolymer, may be used alone or in a stacked fashion. In addition, typical porous nonwoven fabrics, for example, non-woven fabrics composed of glass fiber having a high melting point or polyethylene terephthalate fiber may be used, but the present invention is not limited thereto.

The cylindrical rechargeable lithium secondary battery 1 has been described in this exemplary embodiment, but the detailed description provided herein is not intended to be limiting of the cylindrical lithium secondary battery 1. For example, secondary batteries having any shapes may be used as long as such secondary batteries can operate as the rechargeable lithium secondary battery.

As described above, the rechargeable lithium secondary battery including the negative active material according to one exemplary embodiment of the present invention exhibits excellent discharge capacity and stable cycle-lifespan and rate characteristics, and thus may be effectively used in portable devices requiring a fast charge velocity, such as cellular phones, laptop computers, digital cameras, and camcorders, electric vehicles such as hybrid electric vehicles (HEVs) and plug-in HEVs (PHEVs), and medium/large energy storage systems.

Hereinafter, preferred embodiments of the present invention will be described in detail with reference to the accompanying drawings so as to enable a person skilled in the art to easily embody the present invention. However, it should be understood that the present invention may be embodied in various different forms, but is not limited to the above-described embodiments.

PREPARATIVE EXAMPLE 1

Preparation of Negative Active Material

A solution (a lithium source) obtained by dissolving lithium hydroxide in the form of a lithium salt in water, and a solution (a titanium source) obtained by dissolving titanium oxide in water were added in a ratio of 4:5. The mixed solution was stirred, and dried to prepare a precursor. Thereafter, the precursor was calcined at 750° C. to prepare a core including a lithium titanium oxide ($Li_4Ti_5O_{12}$) containing a surface functional group such as $O^-$ and $CO_2^-$. Here, the $Li_4Ti_5O_{12}$ powder had an average particle size of 8 μm.

The core including the lithium titanium oxide containing the surface functional group was immersed in 2% by weight of an aqueous acetic acid solution for an hour, taken out, and then dried at 80° C. for 6 hours under vacuum to prepare a negative active material.

EXAMPLE 1

Manufacture of Rechargeable Lithium Secondary Battery

The negative active material prepared in Preparative Example 1, a carbon black conductive material, and a PVdF binder were mixed in N-methylpyrrolidone as a solvent in a weight ratio of 92:4:4 to prepare a composition for forming a negative active material layer. Thereafter, the composition was applied to a copper current collector to form a negative active material layer.

Li metal was used as a counter electrode.

A separation film made of porous polyethylene was interposed between the above-described positive and negative electrodes to manufacture an electrode assembly. Thereafter, the electrode assembly was positioned inside a case, and an electrolyte solution was then injected into the case to manufacture a rechargeable lithium secondary battery. In this case, the electrolyte solution was prepared by dissolving 1 M lithium hexafluorophosphate ($LiPF_6$) in an organic solvent including ethylene carbonate, dimethyl carbonate, and ethylmethyl carbonate (at a mixed volume ratio of 3:4:3 for EC, EMC, and DEC).

COMPARATIVE EXAMPLE 1

Manufacture of Rechargeable Lithium Secondary Battery

A rechargeable lithium secondary battery was manufactured in the same manner as in Example 1, except that a $Li_4Ti_5O_{12}$ powder whose surface was not treated was used as the negative active material.

COMPARATIVE EXAMPLE 2

Manufacture of Rechargeable Lithium Secondary Battery

The negative active materials, an $Li_4Ti_5O_{12}$ powder and an acetic acid anhydride powder, a carbon black conductive material, and a PVdF binder were mixed in N-methylpyrrolidone as a solvent in a weight ratio of 91.5:0.5:4:4 to prepare a composition for forming a negative active material layer. Thereafter, the composition was applied to a copper current collector to form a negative active material layer.

A rechargeable lithium secondary battery was manufactured in the same manner as in Example 1, except that the negative active material layer thus prepared was used as a negative electrode.

EXPERIMENTAL EXAMPLE 1

Evaluation of Characteristics of Negative Active Material

For the negative active materials prepared in Preparative Example 1 and Comparative Example 1, which were immersed in an aqueous acetic acid solution and then dried at 80° C. under vacuum, the amount of $Li_2CO_3$ and LiOH remaining in each of the negative active materials prepared according to Example 1 and Comparative Example 1 was measured using a potentiometric titrator (a pH titration method, Model: Metrohm 736 GP Titrino) and Fourier transform infrared spectroscope (FT-IR). Results are shown in FIG. 2 and listed in the following Table 1.

TABLE 1

| Residual amount (ppm) | LiOH | $Li_2CO_3$ | Total |
|---|---|---|---|
| Example 1 | 436 | 1,412 | 1,848 |
| Comparative Example 1 | 524 | 1,631 | 2,155 |

As listed in Table 1, it could be seen that LiOH and $Li_2CO_3$ were detected in a residual amount of 1,848 ppm in the case of Example 1, and that LiOH and $Li_2CO_3$ were detected in a residual amount of 2,155 ppm in the case of Comparative Example 1 in which the negative active material whose surface was not treated was used. That is, it was confirmed that the amount of LiOH and $Li_2CO_3$ remaining on a surface of the negative active material decreased in the case of Example 1 in which the surface-treated negative active material was used.

EXPERIMENTAL EXAMPLE 2

Evaluation of Characteristics of Negative Active Material

To determine a content of moisture formed during charge/discharge of the rechargeable lithium secondary batteries prepared in Example 1 and Comparative Examples 1 and 2, the residual content of moisture was measured using a Karl Fischer titration method.

TABLE 2

| Residual amount (ppm) | Moisture content |
|---|---|
| Example 1 | 658 |
| Comparative Example 1 | 1,847 |
| Comparative Example 2 | 941 |

As listed in Table 2, it could be seen that the residual moisture content was low in the case of Example 1 in which the negative active material was surface-treated with an acetic acid anhydride, compared to Comparative Example 1 in which the negative active material was not surface-treated, and Comparative Example 2 in which the acid anhydride was simply mixed with the core. From these results, it could be seen that moisture was effectively absorbed by the acid anhydride physisorbed onto a surface of the core.

In addition, gas generation according to temperature was determined to check whether the acid anhydride was physisorbed onto a surface of the core in the negative active material prepared in Preparative Example 1. Results are shown in FIG. 2. Here, an acid anhydride chemically absorbed (i.e., chemisorbed) onto a surface of the core was used as the acid anhydride in the case of Comparative Examples 1 and 2.

Referring to FIG. 2, it could be seen that the acid anhydride was not desorbed by heat treatment since the acid anhydride was irreversibly chemisorbed onto the surface of the core. However, it could be seen that the acid anhydride was desorbed by heat treatment when the acid anhydride was physisorbed onto the surface of the core.

EXPERIMENTAL EXAMPLE 3

Measurement of Input/Output Characteristics of Rechargeable Lithium Secondary Battery Input/output characteristics of the rechargeable lithium secondary batteries prepared in Example 1 and Comparative Examples 1 and 2 were measured.

Specifically, a charge/discharge test was performed on a coin-type half battery of the rechargeable lithium secondary battery prepared in Example 1 under conditions of room temperature (25° C.), a voltage ranging from 3.0V to 5 mV, and a current density of 0.1 C, 1 C, 2 C, 3 C, 5 C, and 10 C.

As a result, the capacity retention (%) at room temperature (25° C.) according to the C-rate is shown in FIG. 3. In the case of Example 1, the capacity was retained at an identical level for the first cycle, but the capacity retention (%) for the sixth cycle was capacity retention (%) was 80%. On the other hand, in the case of Comparative Examples 1 and 2, the capacity dropped sharply from the second cycle, and the capacity retention (%) amounted to 75% for the sixth cycles.

Based on the experimental results, it could be seen that the rechargeable lithium secondary battery of Example 1 showed superior input/output characteristics, compared to the rechargeable lithium secondary batteries of Comparative Examples 1 and 2.

INDUSTRIAL APPLICABILITY

The negative active material according to the exemplary embodiments of the present invention includes a core including a lithium titanium oxide represented by the following Formula 1, and a coating layer positioned on a surface of the core and including an acid anhydride physisorbed onto the core.

$$Li_xTi_yO_4 \quad \text{[Formula 1]}$$

In Formula 1, x and y are as defined in the detailed description.

The negative active material may be used as the negative active material for rechargeable lithium secondary batteries. In the rechargeable lithium secondary battery including the negative active material, the battery side reactions and gas generation may be inhibited, and thus battery performance may be improved.

As apparent from the above description, the present invention provides a negative active material for rechargeable lithium secondary batteries capable of inhibiting battery side reactions and gas generation and improving battery performance since moisture formed during redox reaction is effectively absorbed into a surface of the negative active material.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A negative active material for rechargeable lithium secondary batteries comprising:
   a core comprising a lithium titanium oxide represented by the following Formula 1; and
   a coating layer positioned on a surface of the core,
   wherein the coating layer comprises an acid anhydride physisorbed onto the core:

$$Li_xTi_yO_4 \quad \text{[Formula 1]}$$

wherein $0.8 \leq x \leq 1.4$, and $1.6 \leq y \leq 2.2$,
   wherein the coating layer is included in an amount of 0.5 to 3 parts by the weight based on 100 parts by weight of the core.

2. The negative active material according to claim 1, wherein the core contains at least one surface functional group selected from the group consisting of $O^-$ and $CO_2^-$.

3. The negative active material according to claim 1, wherein the lithium titanium oxide of Formula 1 is $Li_4Ti_5O_{12}$ having a spinel structure.

4. The negative active material according to claim 1, wherein the acid anhydride is an anhydride of a carboxylic acid containing 1 to 3 carboxyl groups in a molecule thereof.

5. A method of preparing a negative active material for rechargeable lithium secondary batteries, comprising:
   preparing a core containing at least one surface functional group selected from the group consisting of $O^-$ and $CO_2^-$ by mixing a lithium source and a titanium source so as to prepare a lithium titanium oxide represented by the following Formula 1, and calcining the resulting mixture at a temperature of 750 to 800° C., which is less than a typical calcination temperature; and
   physisorbing an acid anhydride of an organic acid onto a surface of the core by treating the core containing the surface functional group with a solution comprising the organic acid, and drying the core:

$$Li_xTi_yO_4 \quad \text{[Formula 1]}$$

wherein $0.8 \leq x \leq 1.4$, and $1.6 \leq y \leq 2.2$.

6. The method according to claim 5, wherein the organic acid is a carboxylic acid containing 1 to 3 carboxyl groups in a molecule thereof.

7. The method according to claim 5, wherein the organic acid comprises at least one selected from the group consisting of acetic acid, propionic acid, stearic acid, pyruvic acid, acetoacetic acid, glyoxylic acid, oxalic acid, malonic acid, maleic acid, glutaric acid, adipic acid, phthalic acid, trimellitic acid, and a mixture thereof.

8. The method according to claim 5, wherein the organic acid is included in an amount of 0.5 to 3% by weight, based on the total weight of the solution comprising the organic acid.

9. The method according to claim 5, wherein the drying is performed at 60 to 130° C. under vacuum.

10. A rechargeable lithium secondary battery comprising:
a positive electrode comprising a positive active material;
a negative electrode comprising a negative active material and arranged to face the positive electrode; and
an electrolyte solution interposed between the positive electrode and the negative electrode,
wherein the negative active material comprises a core comprising a lithium titanium oxide represented by the following Formula 1, and a coating layer positioned on a surface of the core, and
the coating layer comprises an acid anhydride physisorbed onto the core:

$$Li_xTi_yO_4 \quad \text{[Formula 1]}$$

wherein $0.8 \leq x \leq 1.4$, and $1.6 \leq y \leq 2.2$,
wherein the coating layer is included in an amount of 0.5 to 3 parts by the weight based on 100 parts by weight of the core.

* * * * *